United States Patent
Oda et al.

(10) Patent No.: US 12,080,792 B2
(45) Date of Patent: Sep. 3, 2024

(54) SEMICONDUCTOR DEVICE AND METHOD FOR MANUFACTURING SAME

(71) Applicant: DENSO CORPORATION, Kariya (JP)

(72) Inventors: Youhei Oda, Kariya (JP); Kouichi Sawada, Kariya (JP)

(73) Assignee: DENSO CORPORATION, Kariya (JP)

( * ) Notice: Subject to any disclaimer, the term of this patent is extended or adjusted under 35 U.S.C. 154(b) by 429 days.

(21) Appl. No.: 17/505,747

(22) Filed: Oct. 20, 2021

(65) Prior Publication Data

US 2022/0037523 A1  Feb. 3, 2022

Related U.S. Application Data

(63) Continuation of application No. PCT/JP2020/017393, filed on Apr. 22, 2020.

(30) Foreign Application Priority Data

Apr. 23, 2019 (JP) .................. 2019-082275

(51) Int. Cl.
    *H01L 29/78*    (2006.01)
    *H01L 29/10*    (2006.01)
    *H01L 29/40*    (2006.01)
    *H01L 29/66*    (2006.01)

(52) U.S. Cl.
    CPC ...... *H01L 29/7813* (2013.01); *H01L 29/1095* (2013.01); *H01L 29/407* (2013.01); *H01L 29/66734* (2013.01)

(58) Field of Classification Search
    CPC ............. H01L 29/7813; H01L 29/1095; H01L 29/407; H01L 29/66734; H01L 29/42376; H01L 29/0696; H01L 29/41766; H01L 29/4238; H01L 29/7811; H01L 29/417; H01L 29/7397; H01L 29/78
    See application file for complete search history.

(56) References Cited

U.S. PATENT DOCUMENTS

| | | | |
|---|---|---|---|
| 6,121,650 A * | 9/2000 | Akamatsu | H10B 12/50 257/E21.654 |
| 6,750,508 B2 | 6/2004 | Omura et al. | |
| 7,459,747 B2 * | 12/2008 | Obuchi | H10B 20/25 257/E21.666 |

(Continued)

*Primary Examiner* — Shahed Ahmed
*Assistant Examiner* — Khatib A Rahman
(74) *Attorney, Agent, or Firm* — Posz Law Group, PLC

(57) ABSTRACT

A semiconductor device includes a semiconductor switching element having a drift layer, a body region, a first impurity region, trench gate structures, a high impurity concentration layer, an interlayer insulation film, an upper electrode and a lower electrode. The body region is arranged on the drift layer. The first impurity region is arranged in a surface portion of the body region in the body region and has an impurity concentration higher than the drift layer. Each of the trench gate structures includes a trench. A shield electrode, an intermediate insulation film and a gate electrode layer are stacked through an insulation film in the trench. The high impurity concentration layer is arranged on a side opposite to the body region to sandwich the drift layer between the high impurity concentration layer and the body region. The interlayer insulation film is arranged on the trench gate structures.

2 Claims, 18 Drawing Sheets

(56) References Cited

U.S. PATENT DOCUMENTS

| | | | |
|---|---|---|---|
| 2013/0069146 A1* | 3/2013 | Okumura | H01L 29/4236 |
| | | | 257/E21.135 |
| 2013/0181283 A1 | 7/2013 | Sato | |
| 2014/0217464 A1* | 8/2014 | Higuchi | H01L 29/0834 |
| | | | 257/139 |
| 2015/0372090 A1* | 12/2015 | Oosawa | H01L 29/66734 |
| | | | 438/270 |
| 2016/0079375 A1* | 3/2016 | Yamazaki | H01L 29/7396 |
| | | | 257/330 |
| 2016/0240641 A1* | 8/2016 | Okawara | H01L 29/7397 |
| 2018/0114857 A1* | 4/2018 | Okada | H01L 29/1095 |

\* cited by examiner

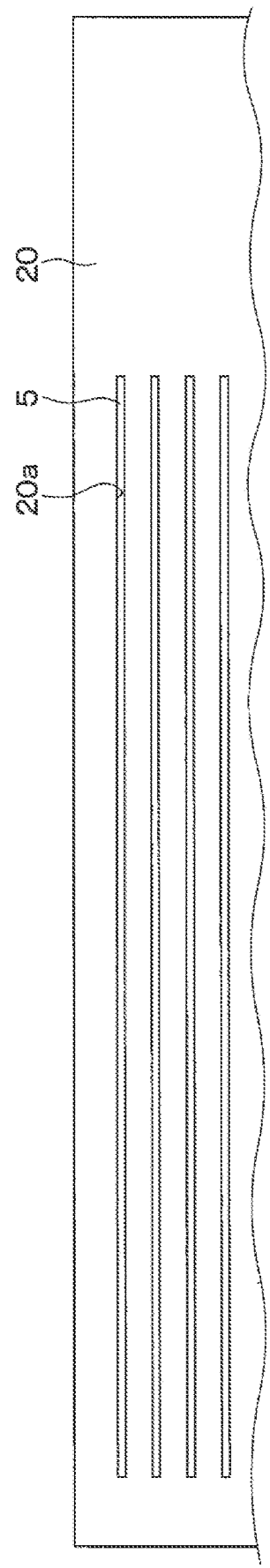

SEMICONDUCTOR DEVICE AND METHOD FOR MANUFACTURING SAME

CROSS REFERENCE TO RELATED APPLICATIONS

The present application is a continuation application of International Patent Application No. PCT/JP2020/017393 filed on, Apr. 22, 2020, which designated the U.S. and claims the benefit of priority from Japanese Patent Application No. 2019-082275 filed on, Apr. 23, 2019. The entire disclosures of all of the above applications are incorporated herein by reference.

TECHNICAL FIELD

The present disclosure relates to a semiconductor device and a method for manufacturing the semiconductor device.

BACKGROUND

A semiconductor device may include a metal-oxide-semiconductor field-effect transistor (MOSFET) having a double-layered trench gate structure.

SUMMARY

The present disclosure describes a semiconductor device including a semiconductor switching element, and further describes a method for manufacturing the semiconductor including forming a trench gate structure.

BRIEF DESCRIPTION OF DRAWINGS

Objects, features and advantages of the present disclosure will become more apparent from the following detailed description made with reference to the accompanying drawings. In the drawings:

FIG. 8A is a top layout diagram of cell portion of a semiconductor device according to a first embodiment during a manufacturing process;

DETAILED DESCRIPTION

Figure 1:
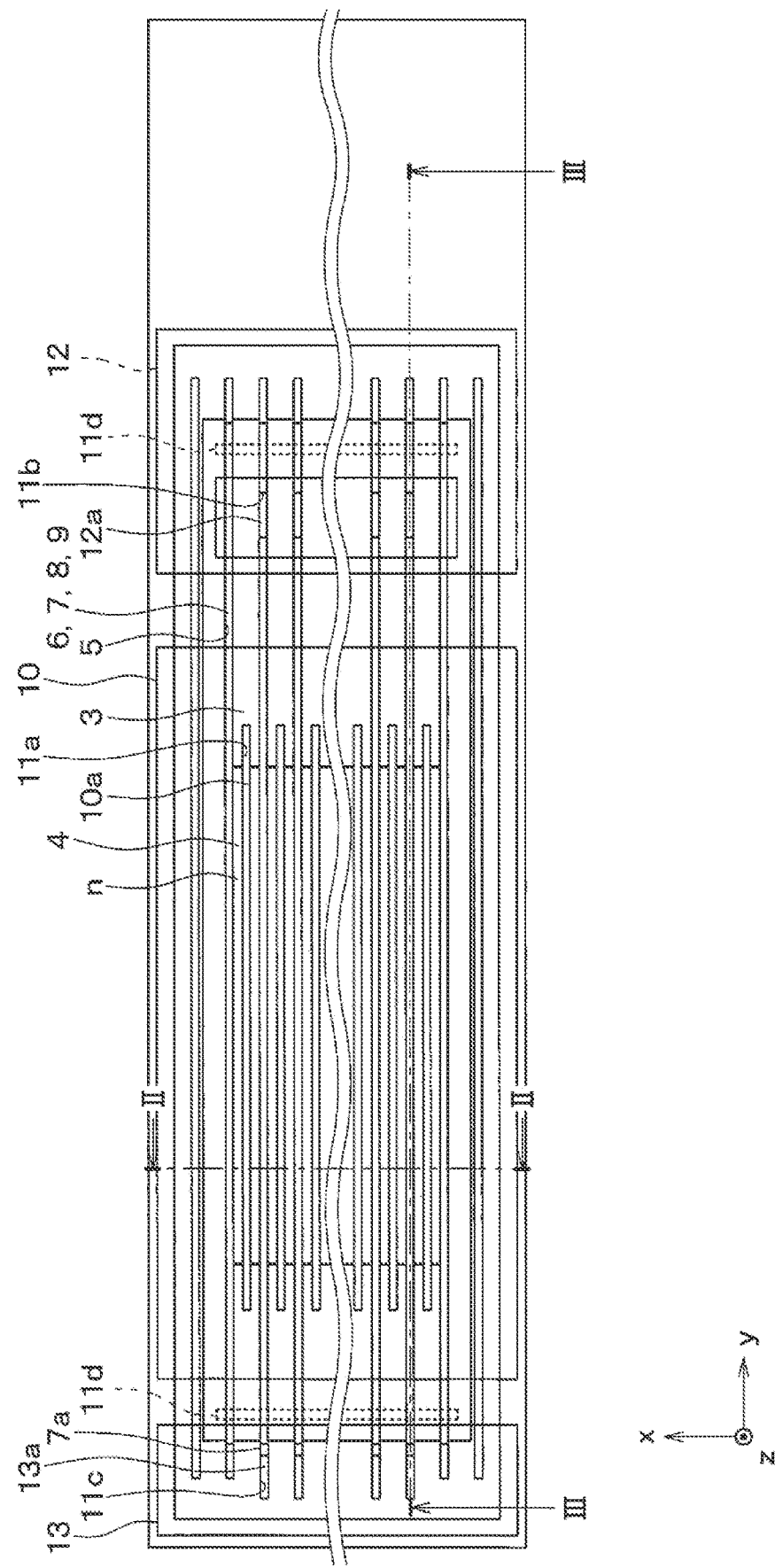
FIG. 1 is a top layout diagram of a cell portion of a semiconductor device according to a first embodiment.

In a semiconductor device including a MOSFET having a double-layered trench gate structure, a trench gate with a double-layered structure is formed at a surface layer portion of a semiconductor substrate with an n⁻ drift layer formed on an n⁺ substrate. The trench gate has a double-layered structure, a shield electrode serving as a source potential is disposed on a bottom portion side of the trench through a shield insulation film, and a gate electrode layer is disposed on a top side of the shield electrode in the trench through a gate insulation film. An interlayer insulation film, in other words, an intermediate insulation film is formed between the shield electrode and the gate electrode layer, and the shield electrode and the gate electrode layer are insulated by the intermediate insulation film.

The gate trench is formed in a linear shape having one direction as the longitudinal direction, and the shield electrode and the gate electrode layer are formed along the gate trench. In order to bring in a contact with the shield electrode, the shield electrode is formed to a surface of the semiconductor substrate at a distal end of the trench, and the shield electrode extends to the end portion of the trench rather than the gate electrode layer.

However, in the above-mentioned structure, at the end portion of the gate trench, the intermediate insulation film attached on the sidewall of the shield electrode along the depth direction of the gate trench may vary according to a manufacturing method or step variation. Therefore, the insulation withstand voltage of the intermediate insulation film becomes lower from a position inside the trench gate in the longitudinal direction to the end of the trench gate structure in the longitudinal direction, and hence the reliability may not be attained.

Additionally, in the semiconductor having the trench gate structure with the double-layered as described above, there are several structures with a biased voltage applied to the insulation films. In such a structure, a voltage for screening is applied to respective insulation films such as a shield insulation film, an intermediate insulation film and a gate insulation film, and the parts that do not reach a desired insulation withstand voltage are removed. Subsequently, it is required to suppress a decrease in the insulation withstand voltage of the intermediate insulation film.

According to a first aspect of the present disclosure, a semiconductor device includes a semiconductor switching element provided with a drift layer, a body region, a first impurity region, trench gate structures, a high impurity concentration layer, an interlayer insulation film, an upper electrode, and a lower electrode. The drift layer has a first conductive type. The body region has a second conductive type and arranged on the drift layer. The first impurity region has the first conductive type, and is arranged in a surface portion of the body region in the body region and having an impurity concentration higher than the drift layer. Each of the trench gate structures includes a trench having one direction as a longitudinal direction and reaching the drift layer from the first impurity region with penetrating the body region. Each of the trench gate structures has a double-layered structure in which a shield electrode, an intermediate insulation film, and a gate electrode layer are stacked in order through an insulation film in the trench. The high impurity concentration layer has the first conductivity type or the second conductive type. The high impurity concentration layer is arranged on a side opposite to the body region to sandwich the drift layer between the high impurity concentration layer and the body region, and has an impurity concentration higher than the drift layer. The interlayer insulation film is arranged on the trench gate structures, the body region and the first impurity region, and has a contact hole connecting the body region and the first impurity region. The upper electrode is electrically connected to the first impurity region and the body region through the contact hole. The lower electrode is electrically connected to the high impurity concentration layer. The shield electrode extends outward from an end portion of the gate electrode layer, and the intermediate insulation film is arranged between the shield electrode and a bottom surface of the gate electrode layer and between the shield electrode and the end portion of the gate electrode layer. A distance of a portion between the end portion of the gate electrode layer and the shield electrode in the one direction and having an insulation property is defined as an effective insulation distance. The effective insulation distance is larger than a thickness of a portion of the intermediate insulation film located at a bottom portion of the gate electrode layer.

According to the above structure, even though the formation of the intermediate insulation film is changed according to the manufacturing method or step variation, it is possible to ensure the insulation withstand voltage of the intermediate insulation film at the end portion of the gate electrode layer. Therefore, it is possible to ensure the reliability while suppressing the decrease in the insulation withstand voltage of the intermediate insulation film.

According to a second aspect of the present disclosure, a method for manufacturing a semiconductor device with a semiconductor having a trench gate structure includes: preparing a substrate, forming trench gate structures, forming a body region, forming a first impurity region, forming an interlayer insulation film, forming a contact hole, forming an upper electrode, and forming a lower electrode. The substrate has a high impurity concentration layer with a first conductive type or a second conductive type, and a drift layer arranged on one surface side of the high impurity concentration layer and having the first conductive type and having an impurity concentration lower than the high impurity concentration layer. The trench gate structures are formed by forming trenches with one direction as a longitudinal direction in the drift layer, and by stacking a shield electrode, an intermediate insulation film and a gate electrode layer in order through an insulation film in each of the trenches to form a double-layered structure. The body region has the second conductive type on the drift layer between the trenches. The first impurity region has the first conductive type with an impurity concentration higher than the drift layer in a surface portion of the body region in the body region. The interlayer insulation film is on each of the trench gate structures, the body region, and the first impurity region. The contact hole connects the body region and the first impurity region in the interlayer insulation film. The upper electrode is electrically connected to the first impurity region and the body region through the contact hole. The lower electrode is electrically connected to the high impurity concentration layer. The forming of the trench gate structures further includes: forming the shield electrode at a bottom surface of each of the trenches and an end portion of each of the trenches in the one direction through the insulation film; forming the intermediate insulation film on the shield electrode; forming the gate electrode layer on the intermediate insulation film, and then removing a portion of the gate electrode layer as a partial removal portion of the gate electrode layer at the end portion in the one direction; and embedding an embedded insulation film into the partial removal portion inside the trenches.

As described above, the gate electrode layer at both ends of the trench gate structure is partially removed, and the embedded insulation film is embedded into the removal portion of the gate electrode layer. As a result, at the both ends in the one direction, the effective insulation distance between the end of the gate electrode layer along the one direction and the shield electrode is larger than the thickness of a portion of the intermediate insulation film located at the bottom part of the gate electrode layer.

As a result, even though the formation of the intermediate insulation film is changed according to the manufacturing method or step variation, it is possible to ensure the insulation withstand voltage of the intermediate insulation film at the end portion of the gate electrode layer. Therefore, it is possible to ensure the reliability while suppressing the decrease in the insulation withstand voltage of the intermediate insulation film.

The following describes multiple embodiments with reference to the drawings. Hereinafter, in the respective embodiments, substantially the same configurations are denoted by identical symbols, and repetitive description will be omitted.

Embodiments of the present disclosure will be described below with reference to the drawings. In the following embodiments, the same reference numerals are assigned to parts that are the same or equivalent to each other.

First Embodiment

The following describes a first embodiment. The present embodiment describes a semiconductor device provided with an n-channel MOSFET having a trench-gate structure with a double-layered structure. The double-layered structure may also be referred to as a two-layered structure. Hereinafter, a structure of the semiconductor device according to the present embodiment will be described with reference to FIGS. 1 to 3.

The MOSFET illustrated in these drawings are formed at a cell region of the semiconductor device. Although the semiconductor device is also provided with an outer peripheral region surrounding a portion illustrated in FIG. 1, the present disclosure merely illustrates the MOSFET. In the following, as shown in FIGS. 1 to 3, the description will be given such that a width direction of the MOSFET is an X direction, a length direction of the MOSFET crossing the X direction is a Y direction, and a thickness direction or a depth direction of the MOSFET, that is, the normal direction to the XY plane is a Z direction.

Figure 2:
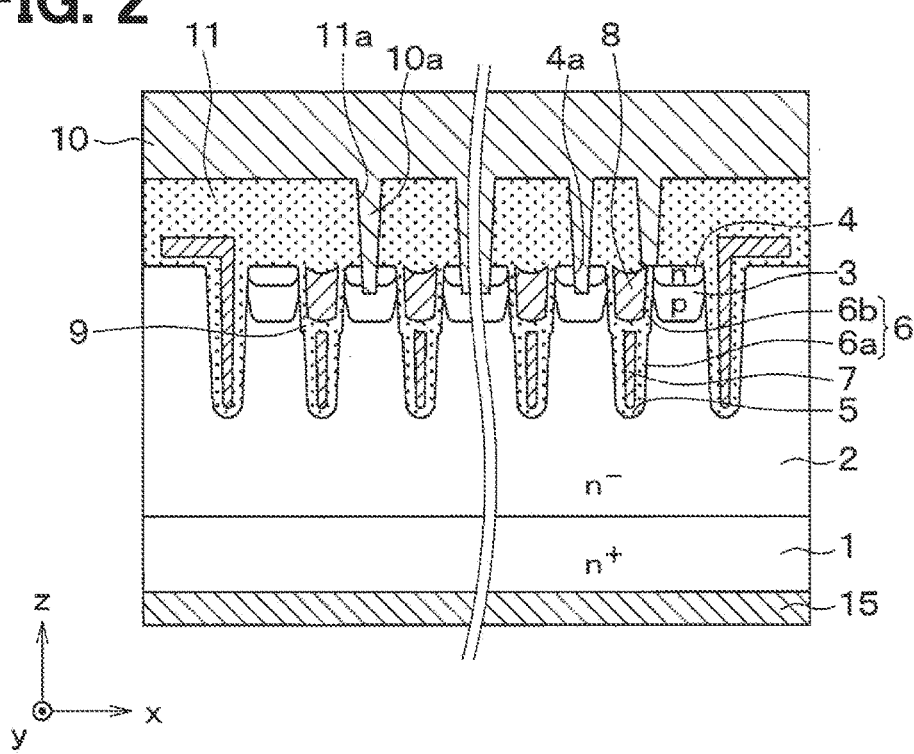
FIG. 2 is a cross-sectional view taken along line II-II in FIG. 1.
Figure 3:
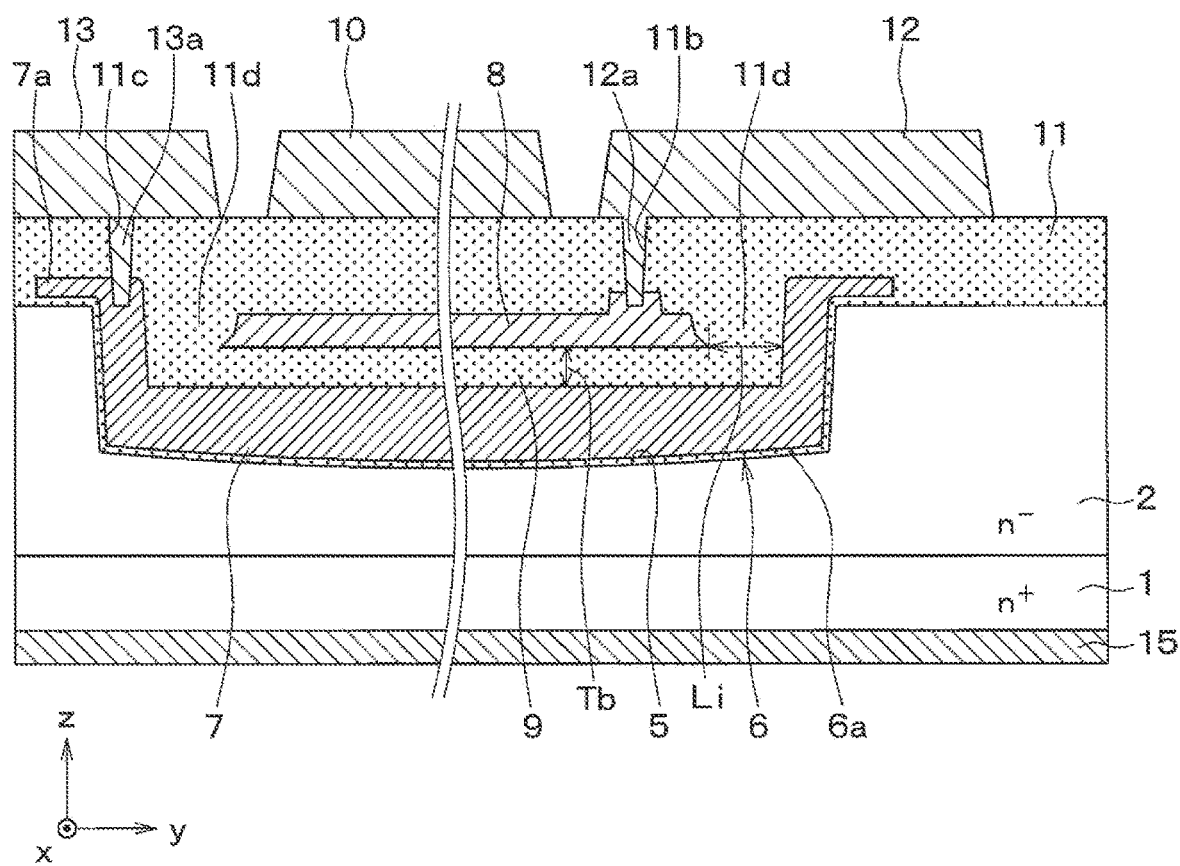
FIG. 3 is a cross-sectional view taken along the line III-III in FIG. 2.

As shown in FIG. 2, the semiconductor device according to the present embodiment is formed with the use of an $n^+$ type semiconductor substrate 1 which is made of a semiconductor material such as silicon having a high impurity concentration. On the surface of the $n^+$ type semiconductor substrate 1, an $n^-$ type drift layer 2 having an impurity concentration lower than that of the $n^+$ type semiconductor substrate 1 is formed.

Further, a p type body region 3 having a relatively low impurity concentration is formed at a certain position in the surface layer portion of the $n^-$ type drift layer 2. The p type body region 3 is formed by, for example, ion-implanting a p type impurity into the $n^-$ type drift layer 2, and also functions as a channel layer for forming a channel region. As shown in FIG. 1, the p type body region 3 is formed with the y direction as the longitudinal direction among multiple trench gate structures described later.

An n type impurity region 4 corresponding to a source region having an impurity concentration higher than that of the $n^-$ type drift layer 2 is provided in a surface layer portion of the p type body region 3. A contact trench 4a is formed at the n type impurity region 4, and the p type body region 3 is exposed at the bottom surface of the contact trench 4a. Although not shown here, $p^+$ contact region as a body contact can be formed at a portion exposed from the p type body region 3. An $n^+$ contact region serving as a source contact can be formed at a side surface of the contact trench 4a of the n type impurity region 4.

Further, multiple gate trenches 5 having a longitudinal direction in one direction are formed between p type body regions 3 and between n type impurity regions 4 in the surface layer portion of the $n^-$ type drift layer 2. The gate trench 5 is a trench for forming a trench gate structure, and in the present embodiment, the gate trenches 5 are arranged in parallel at equal intervals to form a striped layout.

The gate trench 5 is deeper than the p type body region 3, that is, the depth is set to reach the $n^-$ type drift layer 2 from the substrate surface side through the n type impurity region 4 and the p type body region 3. Further, in the present embodiment, the width of the gate trench 5 gradually narrows toward the bottom, and the bottom is rounded.

The inner wall surface of the gate trench 5 is covered with an insulation film 6. The insulation film 6 may include a single individual film, but in the case of the present embodiment, the insulation film 6 includes the shield insulation film 6a covering the lower portion of the gate trench 5 and the gate insulation film 6b covering the upper portion thereof. The shield insulation film 6a covers the side surface of the lower portion from the bottom of the gate trench 5, and the gate insulation film 6b covers the side surface of the upper portion of the gate trench 5. In the present embodiment, the shield insulation film 6a is formed thicker than the gate insulation film 6b.

Further, in the gate trench 5, a shield electrode 7 and a gate electrode layer 8 made of doped Poly-Si are stacked via an insulation film 6 to form a double-layered structure. The shield electrode 7 is fixed to a source potential to reduce a capacitance between a gate and a drain and improve the electrical properties of the vertical MOSFET. The gate electrode layer 8 performs a switching operation of the vertical MOSFET, and forms a channel region in the p type body region 3 on the side surface of the gate trench 5 when a gate voltage is applied.

An intermediate insulation film 9 is formed between the shield electrode 7 and the gate electrode layer 8, and the shield electrode 7 and the gate electrode layer 8 are insulated by the intermediate insulation film 9. The trench 5, the gate insulation film 6, the shield electrode 7, the gate electrode layer 8, and the intermediate insulation film 9 are included in a trench gate structure. The trench gate structures are formed in a stripe shape in which the multiple trench gate structures are aligned in a left-right direction of the paper sheets of FIGS. 1 and 3, or in a left-right direction of the paper sheet of FIG. 2, with a direction perpendicular to the paper sheet of FIG. 2 as the longitudinal direction, for example.

Further, as shown in FIG. 3, at both ends of the gate trench 5 in the longitudinal direction, specifically, at the ends on the front side and the other side of the drawing in FIG. 2, the shield electrode 7 is formed to extend to the outside of the gate electrode layer 8. Then, those portions are exposed from the surface side of the p type body region 3 and the n type impurity region 4 as a shield liner 7*a*.

The interlayer insulation film 11 made of an oxide film or the like is formed so as to cover the gate electrode layer 8, and an upper electrode 10 corresponding to a source electrode and the gate wiring 12 and a shield wiring 13 are formed on the interlayer insulation film 11. As illustrated in FIG. 2, the upper electrode 10 is in contact with the p type contact region 3*a* and the n type contact region 4 through a connection portion 10*a* such as a tungsten (W) plug embedded in the contact hole 11*a* formed in the interlayer insulation film 11. As a result, the upper electrode 10 is electrically connected to the n type impurity region 4 and the p type body region 3.

As illustrated in FIG. 3, the gate wiring 12 is also electrically connected to the gate electrode layer 8 through a connection portion 12*a* such as a tungsten (W) plug in the contact hole 11*b* formed in the interlayer insulation film 11. The shield wiring 13 is also electrically connected to the shield electrode 7 through the connection portion 13*a* such as the tungsten (W) plug in the contact hole 11*c* formed in the interlayer insulation film 11.

Further, a lower electrode 15 corresponding to a drain electrode is formed on a surface of the $n^+$ type semiconductor substrate 1 opposite to the $n^-$ type drift layer 2. The configuration described above configures a basic structure of the vertical MOSFET. A cell region is formed by forming a plurality of vertical MOSFETs providing multiple cells.

As described above, the semiconductor device having the vertical MOSFET is formed. In the vertical MOSFET, the gate electrode layer 8 at both ends in the y-direction, in other words, the longitudinal direction of the trench gate structure is partially removed, and the removed portion is embedded in embedded insulation film 11*d* such as an oxide film. At both ends in the y-direction, an effective insulation distance Li from the end of the gate electrode layer 8 along the y-direction to the shield electrode 7 is larger than the thickness Tb of the portion of the intermediate insulation film 9 located at the gate electrode layer 8.

As a result, even though the formation method of the intermediate insulation film 9 varies depending on a manufacturing method and a process variation, it is possible to ensure the insulation withstand voltage of the intermediate insulation film 9 at the end portion of the gate electrode layer 8. Therefore, it is possible to suppress a decrease in the insulation withstand voltage of the intermediate insulation film 9, and is also possible to ensure the reliability. The end portion of the gate electrode layer 8 may also be referred to as a tip portion of the gate electrode layer 8.

The effective insulation distance Li is a distance of the portion that exhibits the insulating function from the end of the gate electrode layer 8 along the y-direction to the shield electrode 7.

Figure 4:
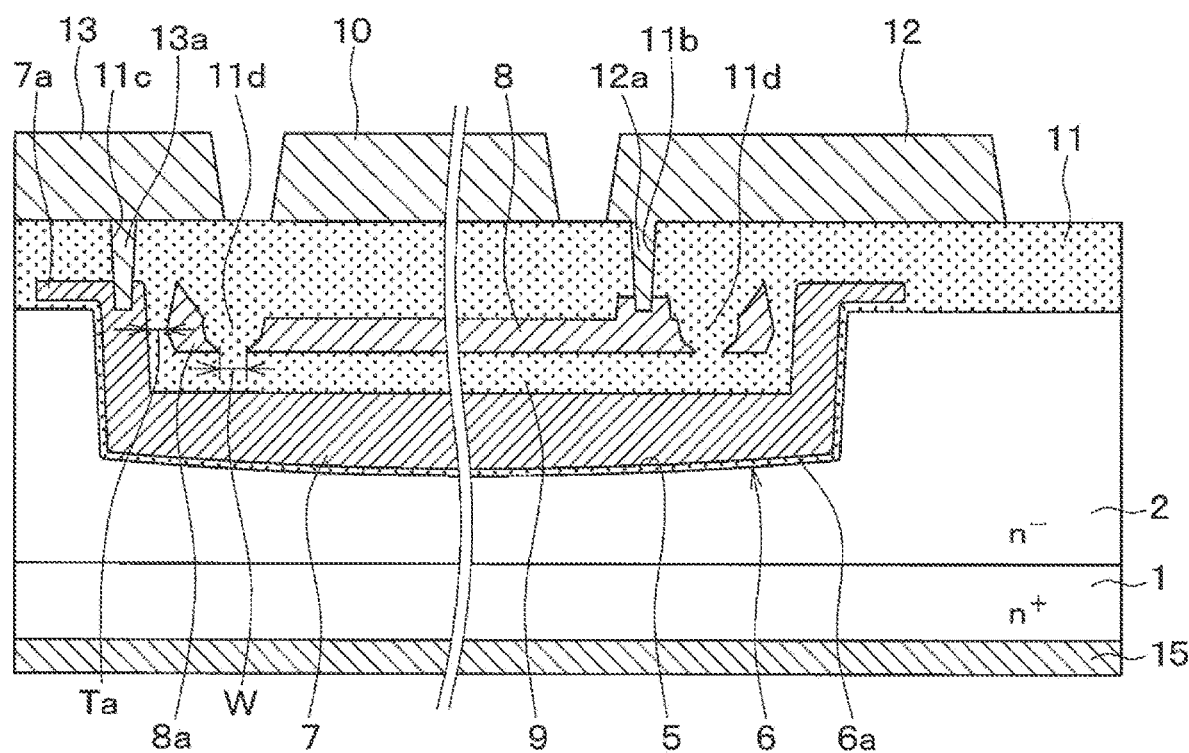
FIG. 4 is a cross-sectional view corresponding to FIG. 3 showing a situation where a residue of a gate electrode layer is generated.

For example, in FIG. 3, the end portion of the gate electrode layer 8 is completely removed in the y-direction. In this situation, the effective insulation distance Li is a distance from the end of the gate electrode layer 8 to the shield layer 7, in other words, the dimension of the embedded insulation film 11*d* and the intermediate insulation film 9 in the y-direction that exhibit the insulating function is the effective insulation distance Li. As illustrated in FIG. 4, the end portion of the gate electrode layer 8 may remain as a residual portion 8*a*. The residual portion 8*a* may also be referred to as residue. Even though the residual portion 8 remains, since the embedded insulation film 11*d* and the intermediate insulation film 9 exhibit the insulating function, it is possible to ensure the insulation withstand voltage between the gate electrode layer 8 and the shield electrode 7 in the y-direction. Since the residual portion 8*a* functions as a conductor, this portion does not exhibit the insulating function. In a situation where the residual portion 8*a* exists, the effective insulation distance Li is obtained by subtracting the dimension of the residual portion 8*a* from the distance from the end of the gate electrode layer 8 to the shield electrode 7 in the y-direction.

The effective insulation distance Li may be at least larger than the thickness Tb of the portion of the intermediate insulation film 9 located at the bottom portion of the gate electrode layer 8, but may also be a value approximately obtaining by adding the width W of the embedded insulation film 11*d* to the thickness Tb. In other words, the thickness Ta of the portion of the intermediate insulation film 9 located at the end of the gate electrode layer 8 may be partially smaller than the thickness Tb due to, for example, manufacturing variations, but is about the same as the thickness Tb. Therefore, the effective insulation distance Li is a value obtained by adding the width W to the thickness Ta which is about the same as the thickness Tb.

For example, the thickness Ta and the thickness Tb are set to about 200 nanometers (nm). The width W is set to 1 micrometer (μm) or more, for example, 3.4 μm. The width W is set as the width when the end portion of the gate electrode layer 8 is removed by etching, and is set by the mask opening width at the time of etching and the amount of etching in the lateral direction. As described above, in the semiconductor device in the present embodiment, since the effective insulation distance Li from the end of the gate electrode layer 8 along the y-direction to the shield electrode 7 is made larger than the thickness Tb of the portion of the intermediate insulation film 9 located at the gate electrode layer 8, it is possible to suppress the decrease in the insulation withstand voltage of the intermediate insulation film 9.

Figure 5A:
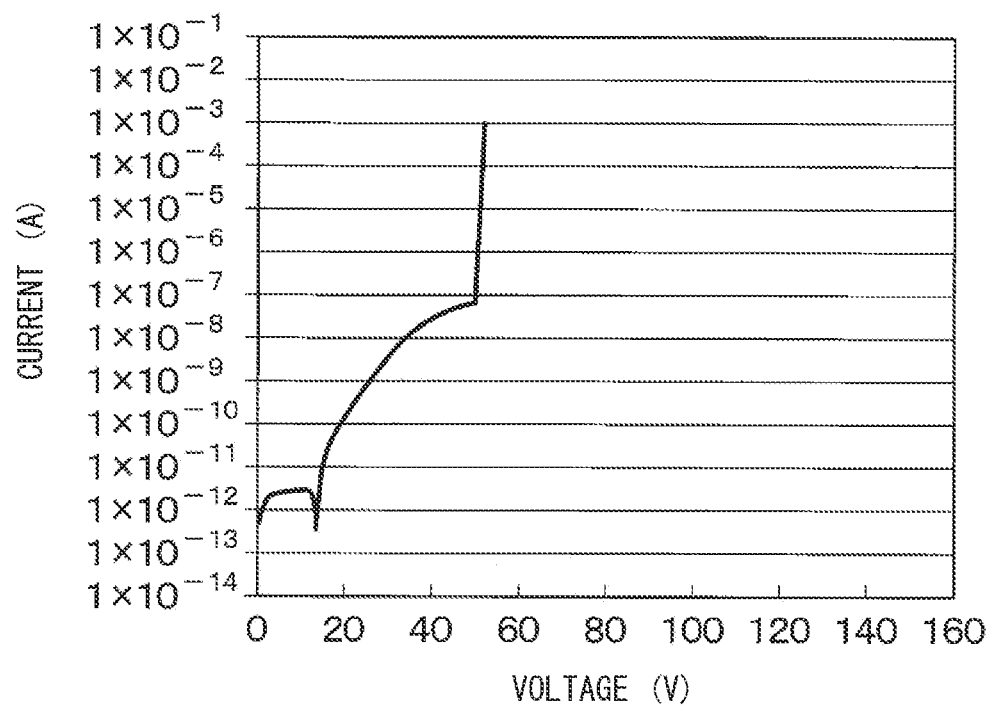
FIG. 5A illustrates a waveform of time zero dielectric breakdown (TZDB) in a comparative structure.
Figure 5B:
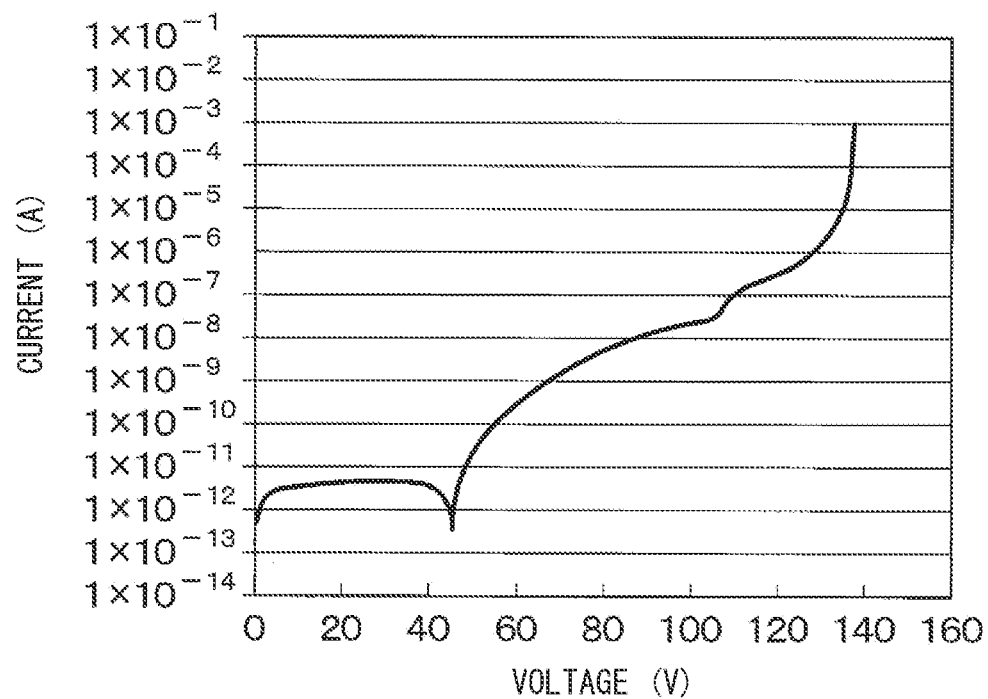
FIG. 5B illustrates a waveform of time zero dielectric breakdown (TZDB) in a structure according to the first embodiment.

The time zero dielectric breakdown (TZDB) waveform was examined for reference. FIG. 5A illustrates a TZDB wave in a comparative structure, in other words, the structure without removing the end portion of the gate electrode layer 8. FIG. 5B illustrates the TZDB waveform in a structure according to the present embodiment. According to these drawings, the structure according to the present embodiment, as the gate voltage for insulation breakdown becomes larger, it is possible to limit the current I at the time of applying the identical gate voltage G, as compared with the comparative example. Therefore, it can been seen that it is possible for the structure according to the present embodiment to suppress the decrease in the insulation withstand voltage of the intermediate insulation film 9.

Next, a method for manufacturing the semiconductor device according to the present embodiment will be described with reference to FIGS. 6A to 6J, FIGS. 7A to 7J and FIGS. 8A to 8F. FIGS. 6A to 6J and FIGS. 7A to 7J are cross sectional views respectively corresponding to steps in the method for manufacturing the semiconductor device. FIGS. 8A to 8F are top layout views of the cell portion corresponding to each step, but only a part of the steps are shown.

Figure 6A:
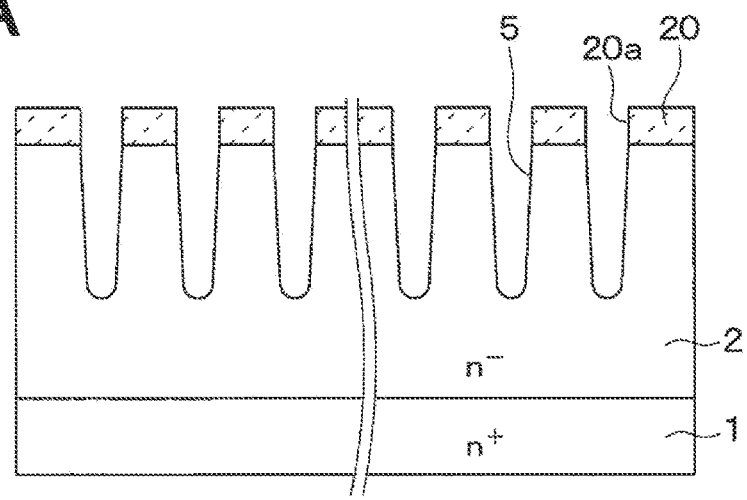
FIG. 6A is a cross-sectional view of the semiconductor device according to the first embodiment during a manufacturing process, and illustrates the manufacturing process at the cross-sectional surface corresponding to FIG. 2.
Figure 7A:
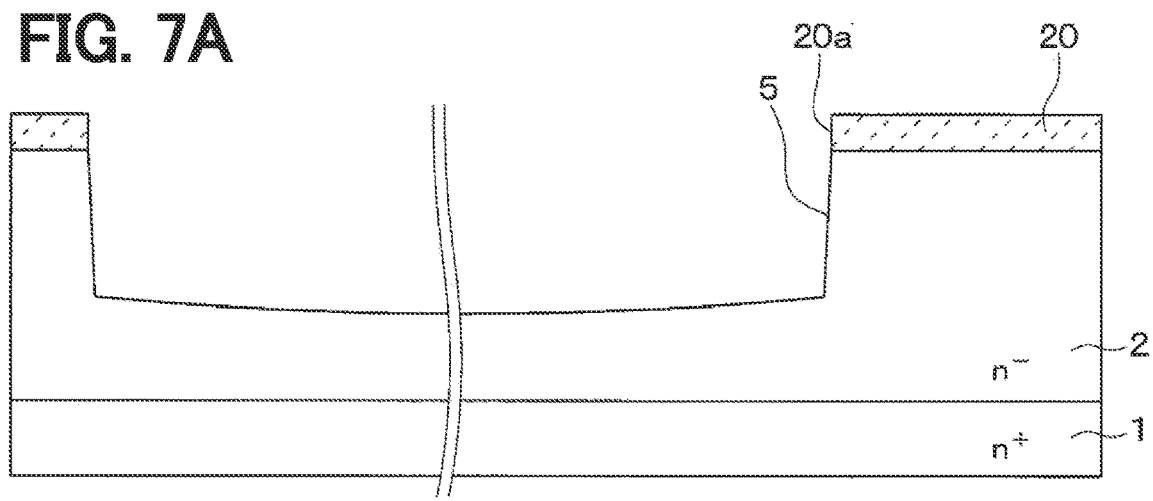
FIG. 7A is a cross-sectional view of the semiconductor device according to the first embodiment during a manufacturing process, and illustrates the manufacturing process at the cross-sectional surface corresponding to FIG. 3.

(Process in FIGS. 6A, 7A)

First, by preparing the semiconductor substrate 1 and epitaxially growing the $n^-$ type drift layer 2 on the surface of the semiconductor substrate 1, the substrate is prepared such that the $n^-$ type drift layer 2 is formed on one surface side of the semiconductor substrate 1 corresponding to the high impurity concentration layer. Next, a hard mask 20 is arranged for having an opening at a prospective region for forming the gate trench 5. The top layout of the hard mask 20 at this time is as shown in FIG. 8A. Subsequently, the gate trench 5 is formed by etching using the hard mask 20 as a mask.

Figure 6B:
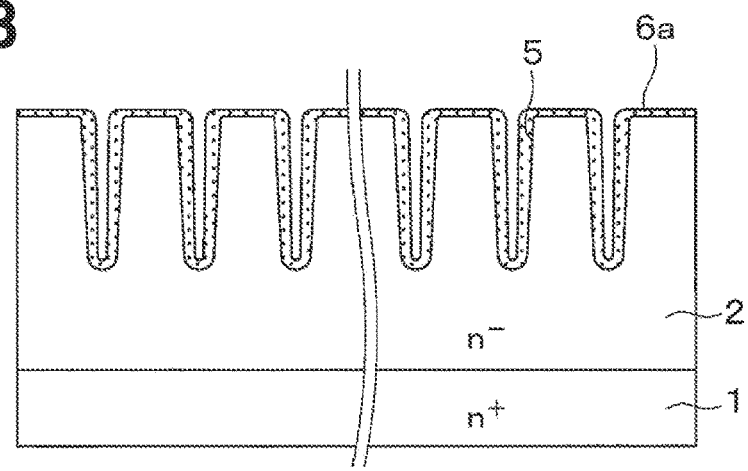
FIG. 6B is a cross-sectional view illustrating a manufacturing process of the semiconductor device subsequent to FIG. 6A.
Figure 7B:
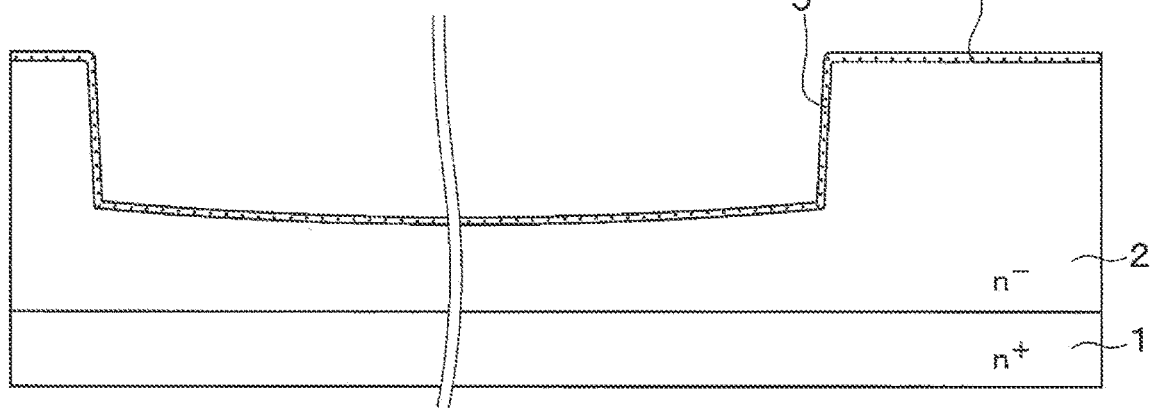
FIG. 7B is a cross-sectional view illustrating a manufacturing process of the semiconductor device subsequent to FIG. 7A.

(Process Shown in FIGS. 6B, 7B)

Subsequently, after removing the hard mask 20, a shield insulation film 6a is formed on the surface of the n⁻ type drift layer 2 including the inner wall surface of the gate trench 5 by thermal oxidation or the like.

Figure 6C:
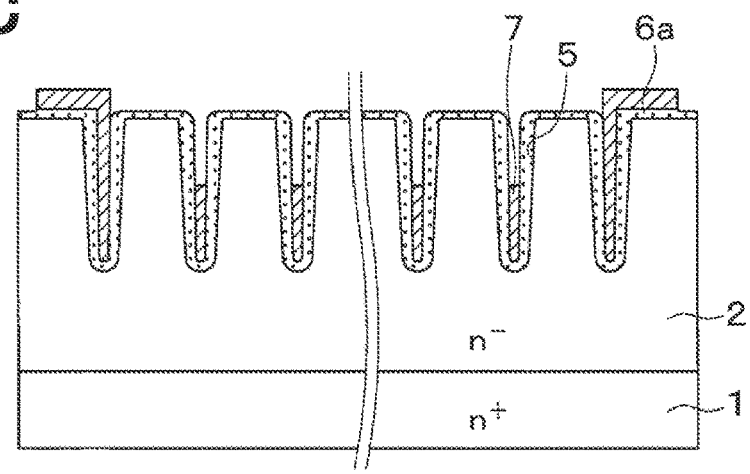
FIG. 6C is a cross-sectional view illustrating a manufacturing process of the semiconductor device subsequent to FIG. 6B.
Figure 7C:
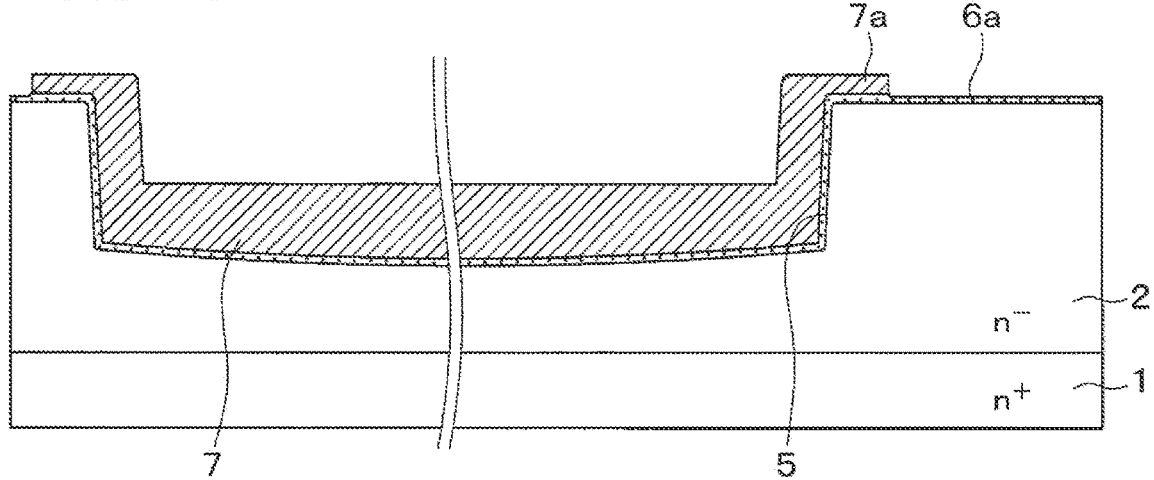
FIG. 7C is a cross-sectional view illustrating a manufacturing process of the semiconductor device subsequent to FIG. 7B.

(Process Shown in FIGS. 6C, 7C)

Figure 8B:
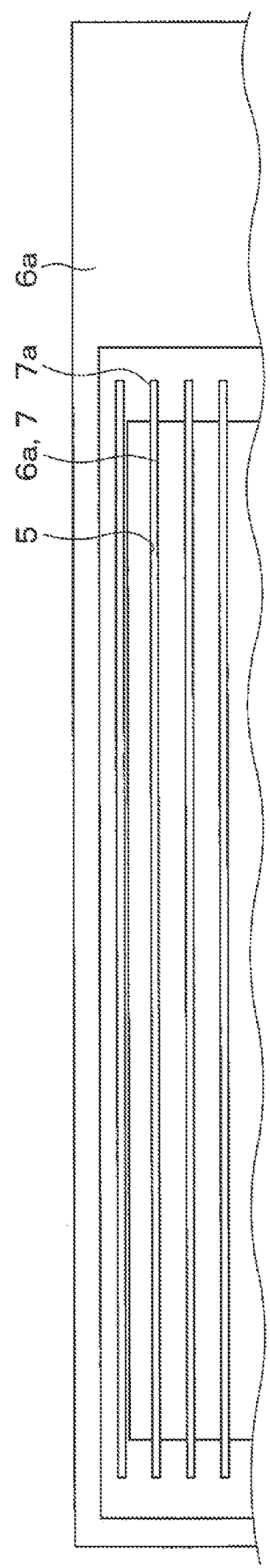
FIG. 8B is a cross-sectional view illustrating a manufacturing process of the semiconductor device subsequent to FIG. 8A.

Then, the doped polysilicon is stacked on the shield insulation film 6a and then etched back, and the doped polysilicon is left, for example, at the bottom of the gate trench 5 and the end of the gate trench 5 to form the shield electrode 7 and the shield liner 7a. The outermost gate trench 5 is left embedded in doped polysilicon and used as the shield liner 7a. The top layout at this time is as shown in FIG. 8B.

Figure 6D:
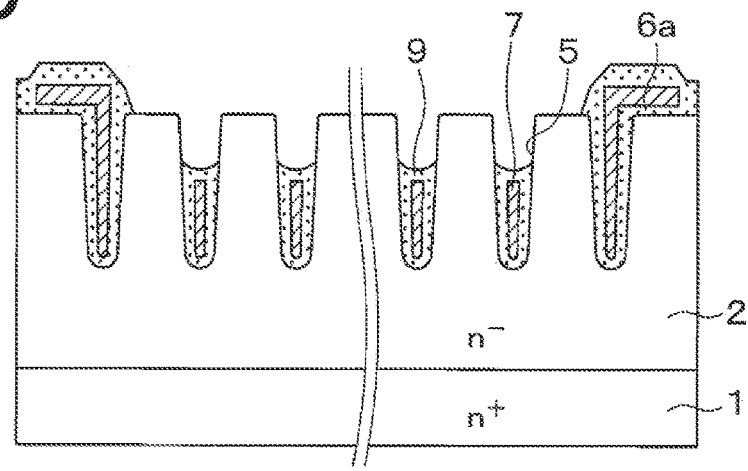
FIG. 6D is a cross-sectional view illustrating a manufacturing process of the semiconductor device subsequent to FIG. 6C.
Figure 7D:
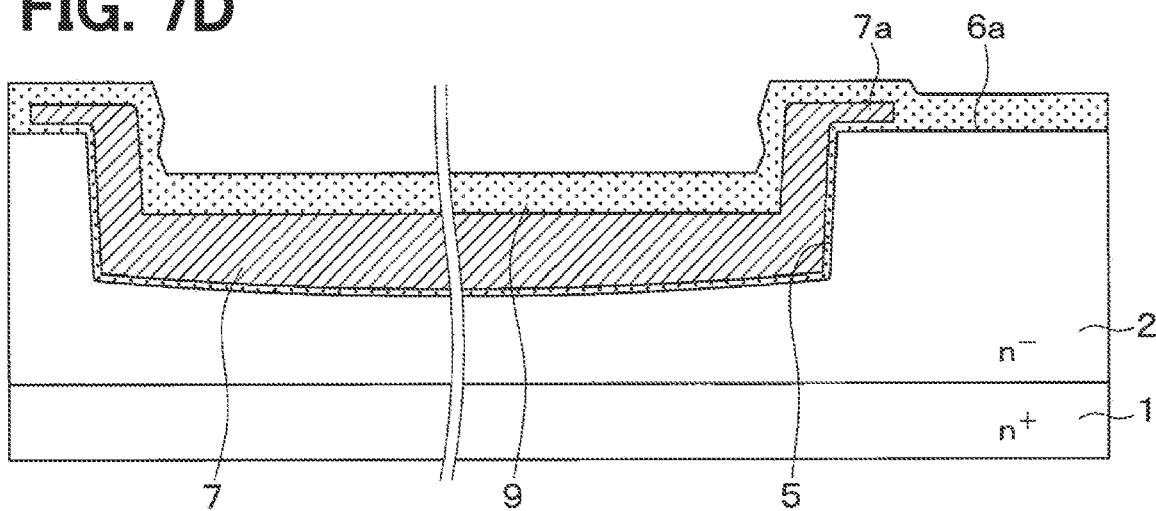
FIG. 7D is a cross-sectional view illustrating a manufacturing process of the semiconductor device subsequent to FIG. 7C.

(Process Shown in FIGS. 6D, 7D)

Further, a portion of the shield insulation film 6a formed on the upper side surface of the gate trench 5 or on the surface of the n⁻ type drift layer 2 is etched and removed. Then, the insulation film is deposited by plasma CVD (chemical vapor deposition) or the like to cover the upper side of the shield electrode 7 and the upper side of the gate trench 5, and then etched using a mask so that only the part formed on the shield electrode 7 and the shield liner 7a remains. As a result, the intermediate insulation film 9 is formed.

Figure 6E:
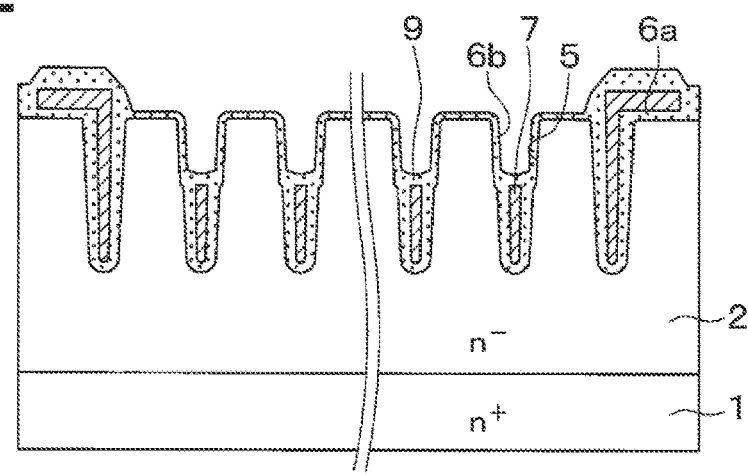
FIG. 6E is a cross-sectional view illustrating a manufacturing process of the semiconductor device subsequent to FIG. 6D.
Figure 7E:
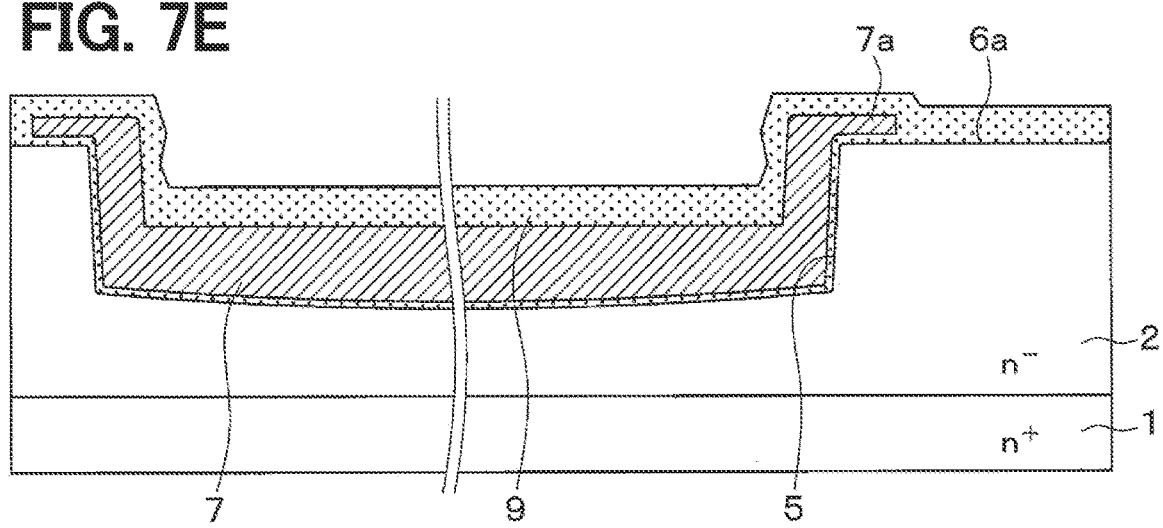
FIG. 7E is a cross-sectional view illustrating a manufacturing process of the semiconductor device subsequent to FIG. 7D.

(Process Shown in FIGS. 6E, 7E)

The gate insulation film 6b is formed by forming an insulation film on the upper side surface of the gate trench 5 by thermal oxidation or the like.

Figure 6F:
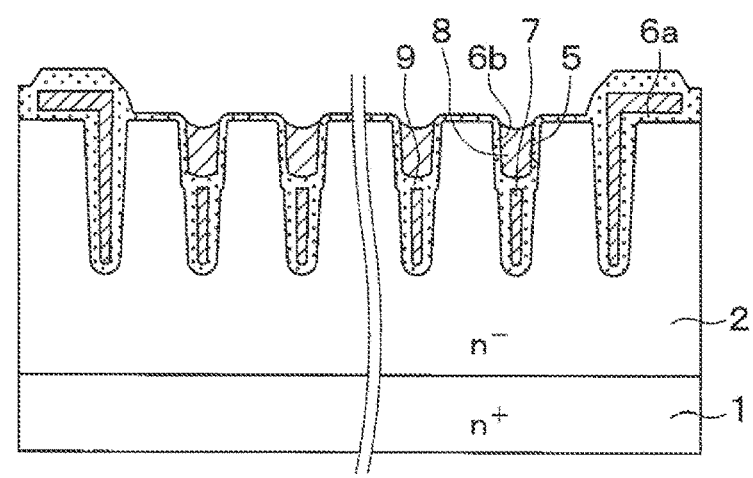
FIG. 6F is a cross-sectional view illustrating a manufacturing process of the semiconductor device subsequent to FIG. 6E.
Figure 7F:
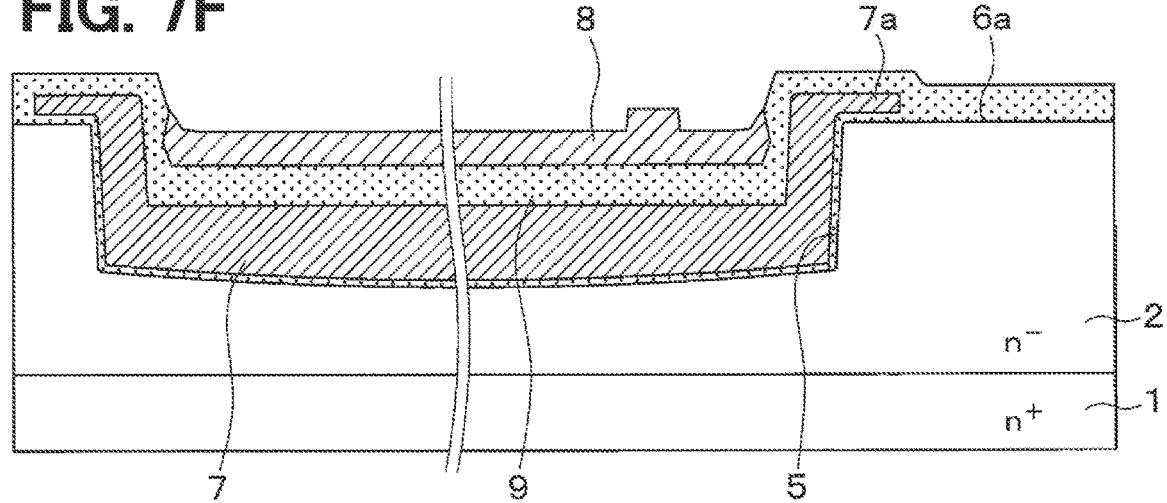
FIG. 7F is a cross-sectional view illustrating a manufacturing process of the semiconductor device subsequent to FIG. 7E.

(Process Shown in FIGS. 6F 7F)

Figure 8C:
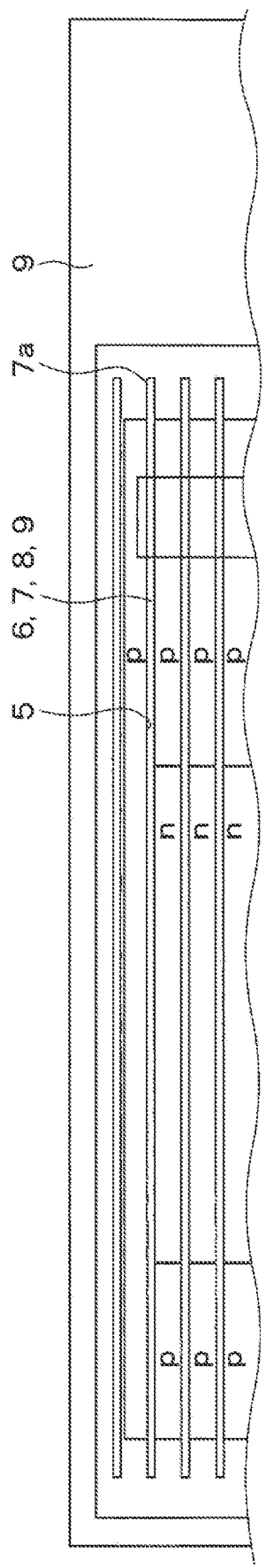
FIG. 8C is a cross-sectional view illustrating a manufacturing process of the semiconductor device subsequent to FIG. 8B.

The doped polysilicon is deposited again and then etched back to form the gate electrode layer 8 in the gate trench 5. As a result, a trench gate structure is formed. Since a portion of the gate electrode layer 8 is connected to the gate wiring 12, the gate electrode layer 8 is left in a partially protruding state. The top layout at this time is as shown in FIG. 8C.

Figure 6G:
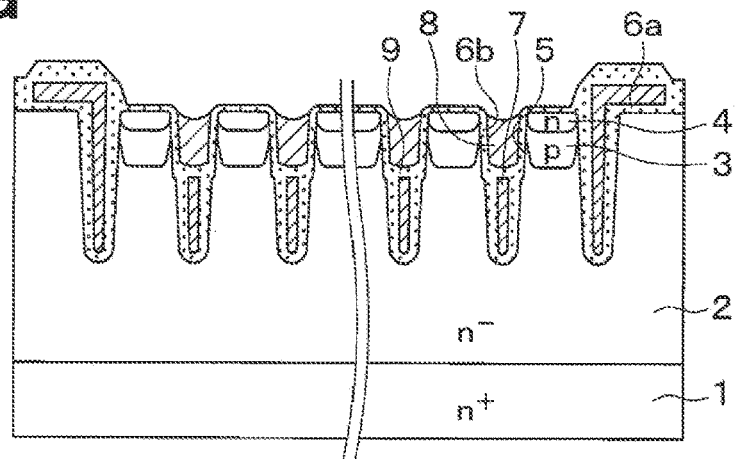
FIG. 6G is a cross-sectional view illustrating a manufacturing process of the semiconductor device subsequent to FIG. 6F.
Figure 7G:
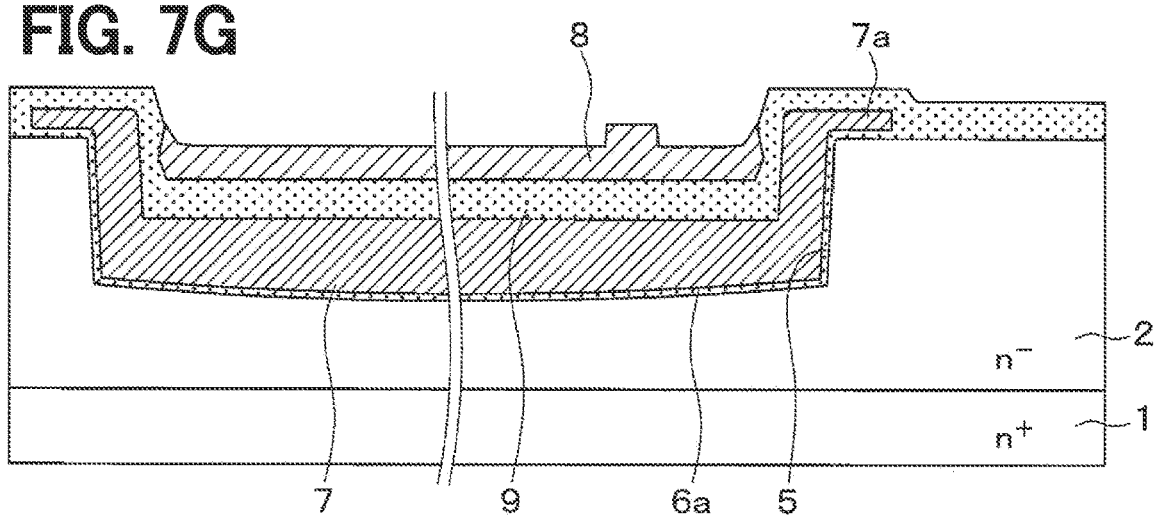
FIG. 7G is a cross-sectional view illustrating a manufacturing process of the semiconductor device subsequent to FIG. 7F.

(Process Shown in FIGS. 6G, 7G)

The p type body region 3 is formed by ion-implanting the p type impurities. After a mask (not shown), in which the area where the n type impurity region 4 is to be formed is opened, is placed, n type impurities are ion-implanted to form the n type impurity region 4.

Figure 6H:
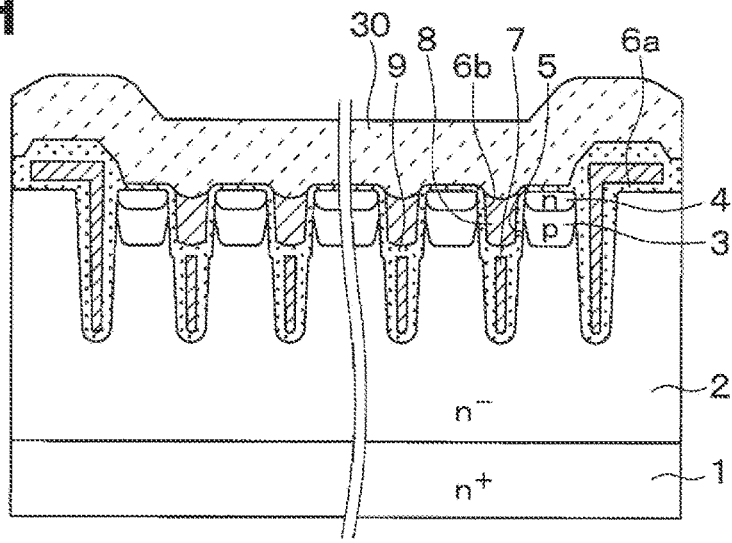
FIG. 6H is a cross-sectional view illustrating a manufacturing process of the semiconductor device subsequent to FIG. 6G.
Figure 7H:
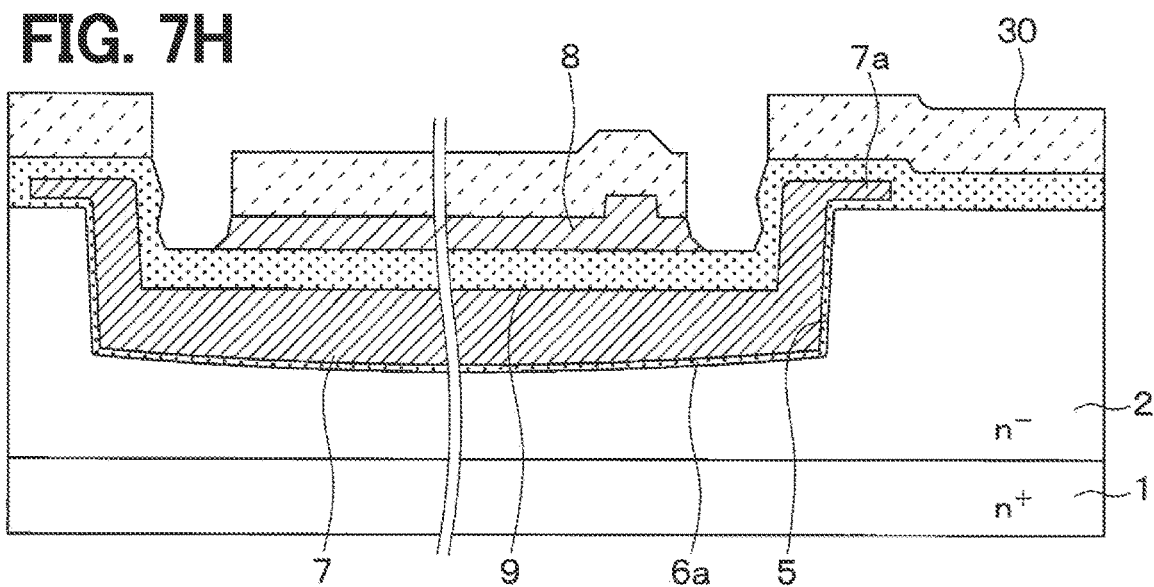
FIG. 7H is a cross-sectional view illustrating a manufacturing process of the semiconductor device subsequent to FIG. 7G.

(Process Shown in FIGS. 6H, 7H)

Figure 8D:
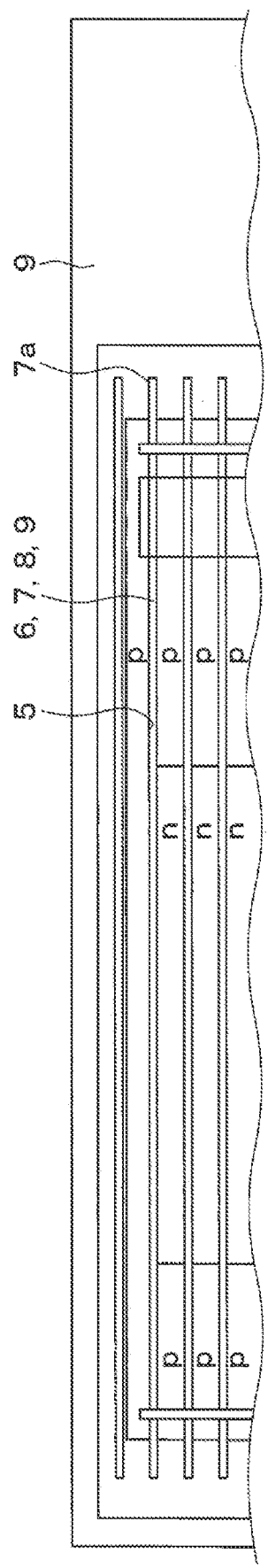
FIG. 8D is a cross-sectional view illustrating a manufacturing process of the semiconductor device subsequent to FIG. 8C.
Figure 8E:
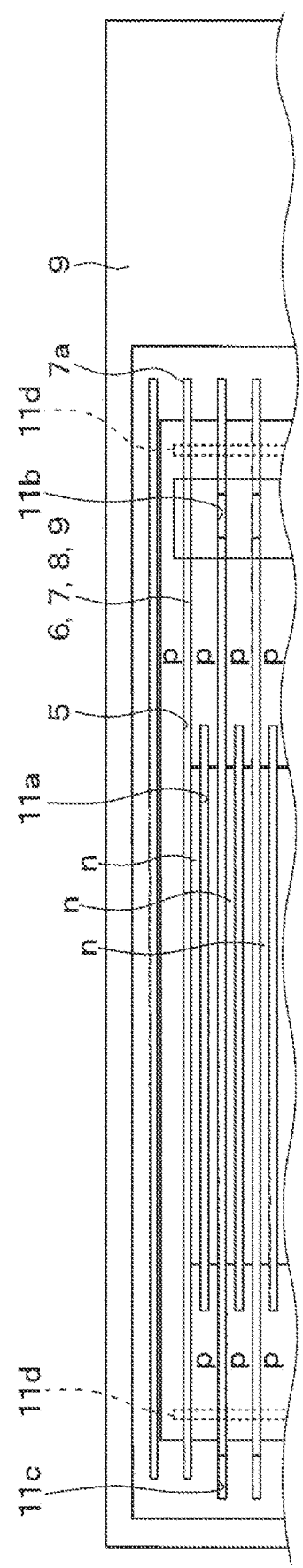
FIG. 8E is a cross-sectional view illustrating a manufacturing process of the semiconductor device subsequent to FIG. 8D.
Figure 8F:
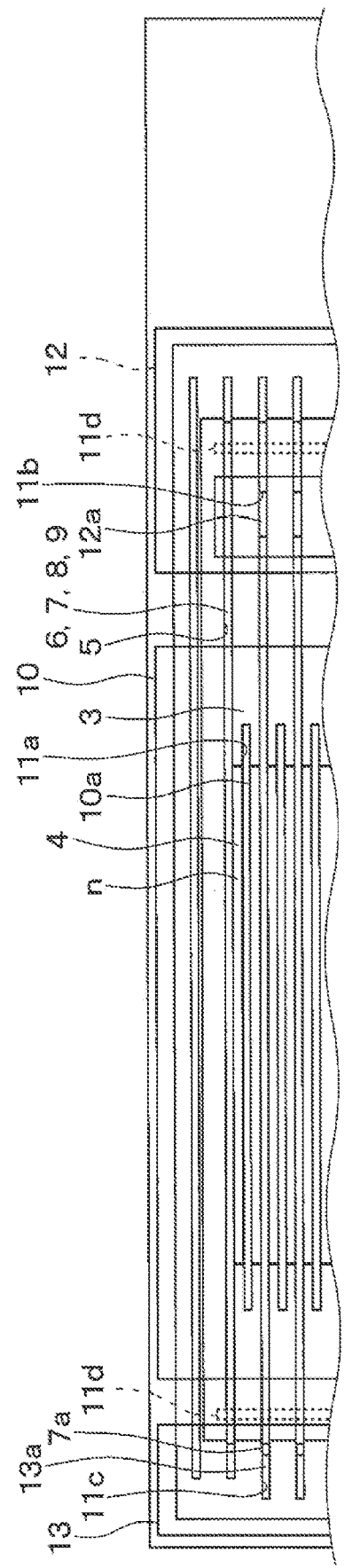
FIG. 8F is a cross-sectional view illustrating a manufacturing process of the semiconductor device subsequent to FIG. 8E.

After forming a mask 30 for covering the surface such as the gate electrode layer 8 or the gate insulation film 6b, the prospective region or planned region of the mask 30 for forming the embedded insulation film 11d is opened. Then, the end portion of the gate electrode layer 8 is removed by etching the doped polysilicon covered by the mask 30. The top layout at this time is as shown in FIG. 8D.

At this time, the amount of over-etching is increased by 50% so that the doped polysilicon is surely removed. For example, in a situation where the thickness of doped polysilicon is set to 1 μm, the etching amount is set to that the thickness of 1.5 μm can be removed. For example, in a situation where the opening width of the mask 30 is set to 0.4 μm, the etching amount in the lateral direction is 1.5 μm so that it is possible to remove the end portion of the gate electrode layer 8 by 3.4 μm.

Depending on the opening position of the mask 30, as illustrated in FIG. 4, the end portion of the gate electrode layer 8 may not be completely removed and may remain as the residual portion 8a. However, even though the residual portion 8a remains, the effective insulation distance Li can be set.

Figure 6I:
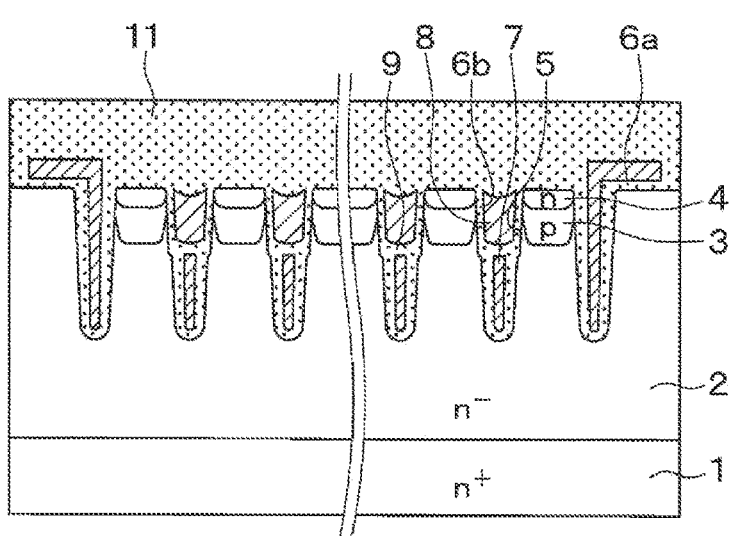
FIG. 6I is a cross-sectional view illustrating a manufacturing process of the semiconductor device subsequent to FIG. 6H.
Figure 7I:
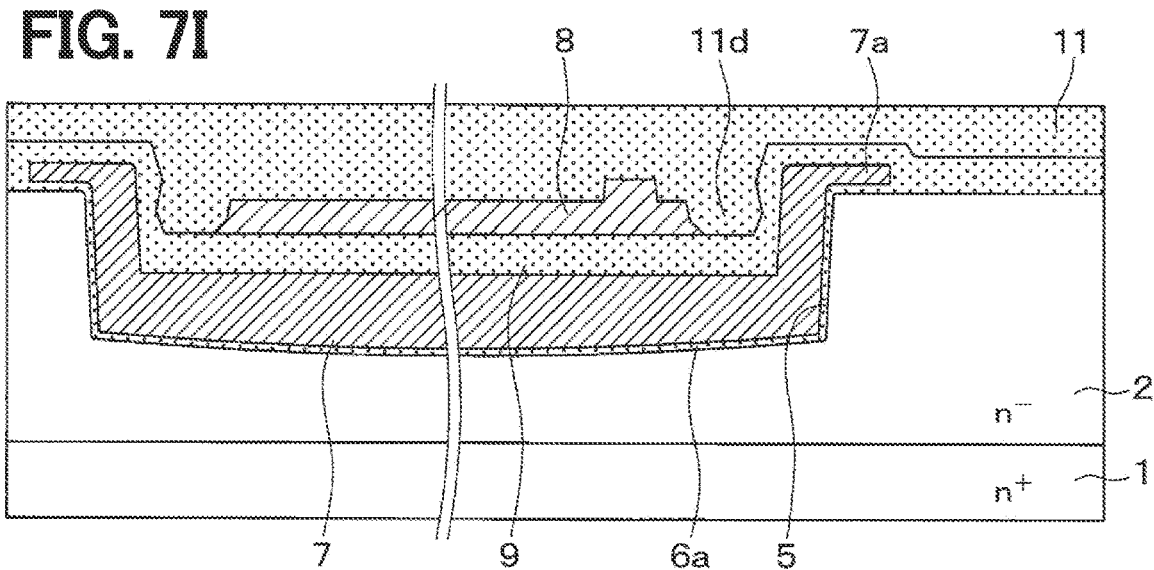
FIG. 7I is a cross-sectional view illustrating a manufacturing process of the semiconductor device subsequent to FIG. 7H.

(Process Shown in FIG. 6I, 7I)

Subsequently, an interlayer insulation film 11 made of an oxide film or the like is formed by CVD or the like, and then flattening and polishing is performed to flatten the surface of the interlayer insulation film 11. As a result, the interlayer insulation film 11 is also embedded in the portion opened by removing the end portion of the gate electrode layer 8, and this portion becomes the embedded insulation film 11d. The top layout at this time is as shown in FIG. 8D.

Figure 6J:
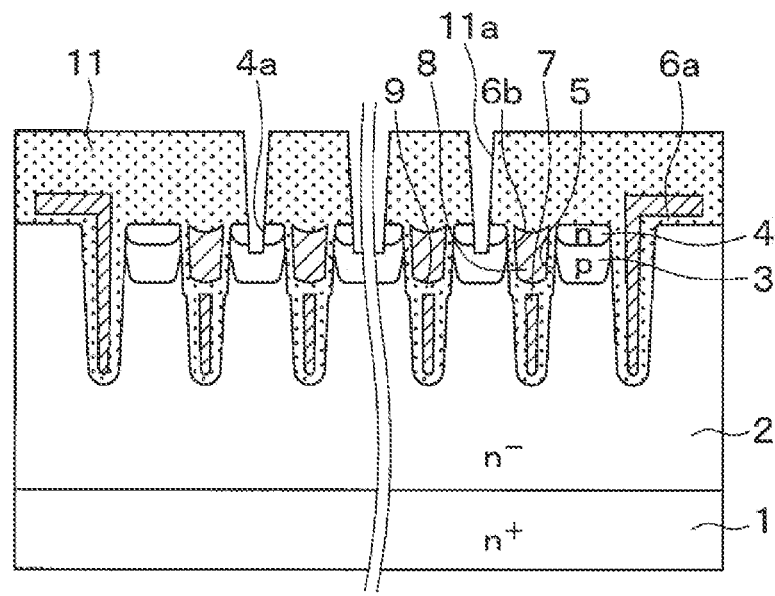
FIG. 6J is a cross-sectional view illustrating a manufacturing process of the semiconductor device subsequent to FIG. 6I.
Figure 7J:
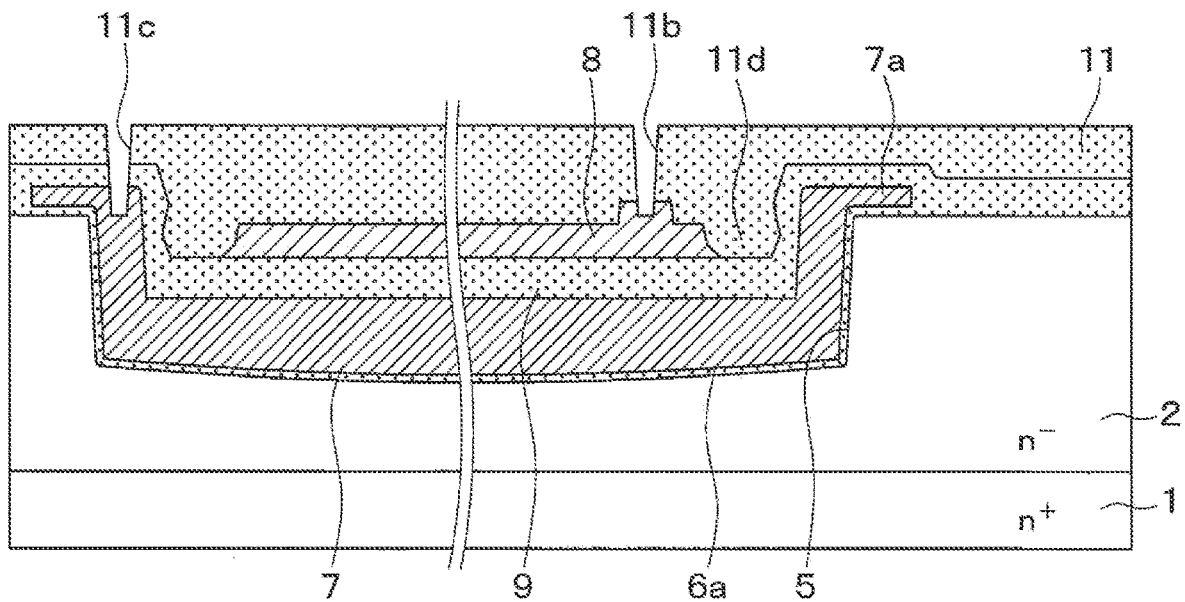
FIG. 7J is a cross-sectional view illustrating a manufacturing process of the semiconductor device subsequent to FIG. 7I.

(Process Shown in FIG. 6J, 7J)

After the hard mask (not shown) is arranged, the contact holes 11a to 11c are formed with respect to the interlayer insulation film 11 by etching the interlayer insulation film 11 while being covered by the hard mask. As a result, a portion of the surface of the n type impurity region 4 is exposed.

After the hard mask is removed, silicon etching is performed using the interlayer insulation film 11 as a mask to form a contact trench 4b at a position corresponding to the contact hole 11a. As a result, the p type body region 3 is exposed at the bottom surface of the contact trench 4a.

Figure 6K:
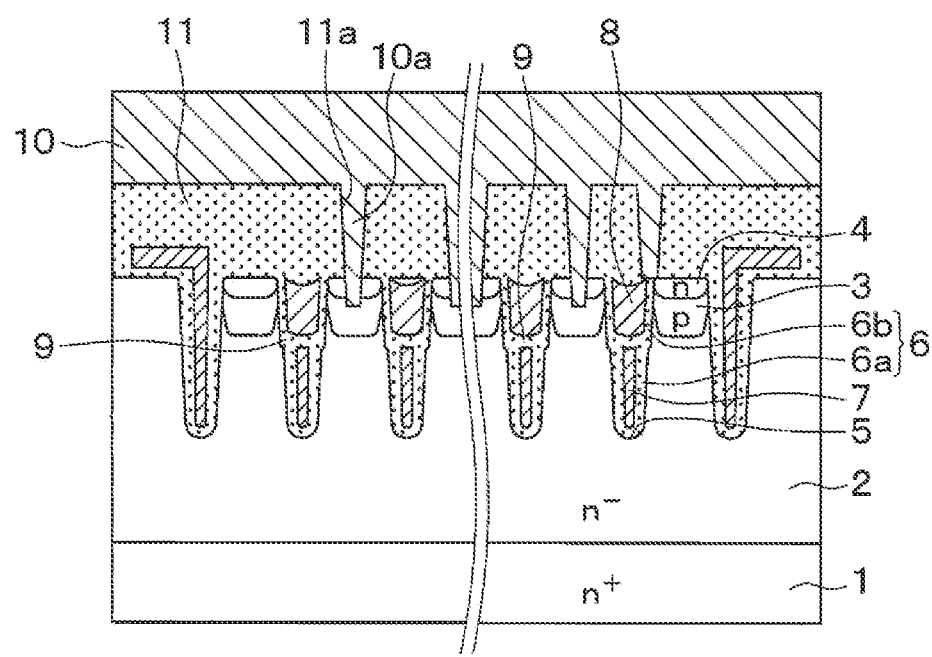
FIG. 6K is a cross-sectional view illustrating a manufacturing process of the semiconductor device subsequent to FIG. 6J.
Figure 7K:
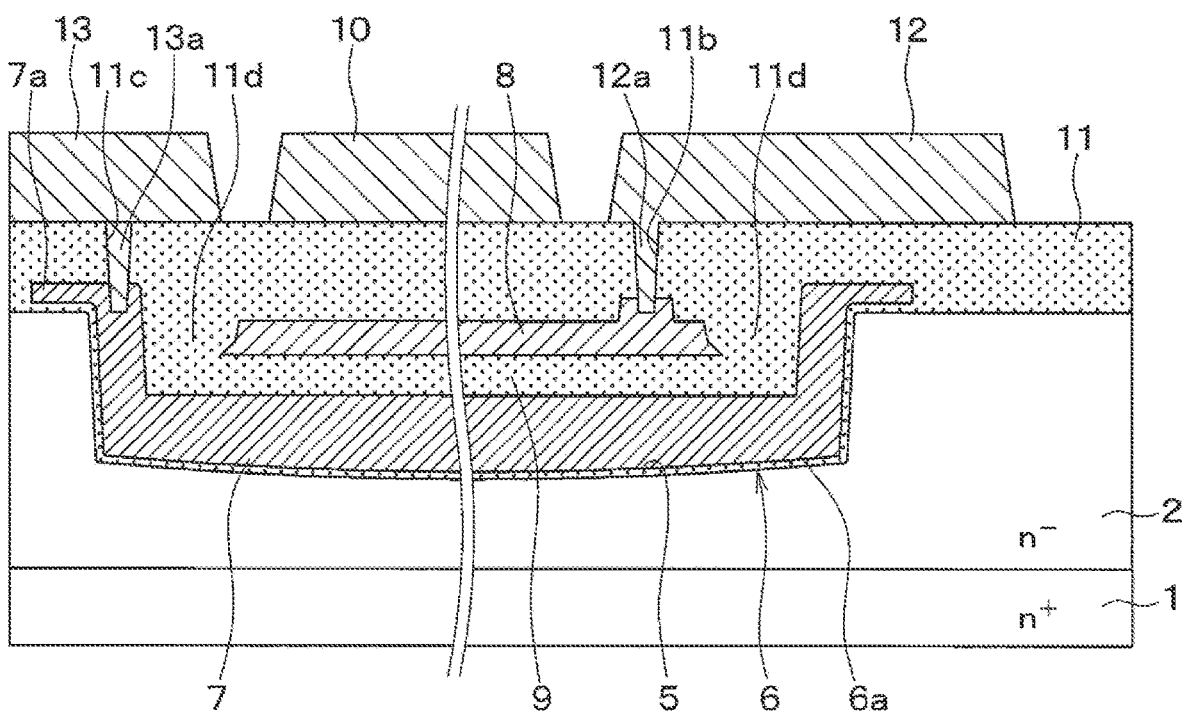
FIG. 7K is a cross-sectional view illustrating a manufacturing process of the semiconductor device subsequent to FIG. 7J.

(Process Shown in FIG. 6K, 7K)

As a wiring processing step, a step of forming the connection portions 10a, 12a, 13a inside the contact holes 11a to 11c is formed. Then, a wiring material such as aluminum (Al) is further formed on the surface of the interlayer insulating film 11, and the upper electrode 10, the gate wiring 12 and the shield wiring 13 are formed by patterning the interlayer insulation film 11.

Finally, a step of forming the lower electrode 15 is performed. In this way, the semiconductor device having the vertical MOSFET according to this embodiment is completed.

As described above, in the semiconductor device in the present embodiment, the effective insulation distance Li from the end of the gate electrode layer 8 along the y-direction to the shield electrode 7 is larger than the thickness Tb of the portion of the intermediate insulation film 9 located at the gate electrode layer 8. Therefore, it is possible to suppress a decrease in the insulation withstand voltage of the intermediate insulation film 9, and is also possible to ensure the reliability.

Other Embodiments

While the present disclosure has been described in accordance with the embodiment described above, the present disclosure is not limited to the embodiment and includes various modifications and equivalent modifications. Furthermore, various combinations and aspects, and other combination and aspect including only one element, more than one element or less than one element, are also within the sprit and scope of the present disclosure.

(1) For example, in the above embodiment, the high impurity concentration layer and the n⁻ type drift layer 2 are formed in the semiconductor substrate 1 by forming a high impurity concentration impurity region on the semiconductor substrate 1 and epitaxially growing the n⁻ type drift layer 2 on the impurity region. This is only an example of a case where a high impurity concentration layer is formed on the side opposite to the p type body region 3 with the drift layer sandwiched between them. Alternatively, the drift layer may be provided by the semiconductor substrate, and the ion implantation and the like is performed on the one side, so that the high impurity concentration layer may be formed.

(2) In the embodiment described above, the trench gate structure is formed, and then the p type body region and the n type impurity region 4 are formed. However, the formation order may be reversed. In other words, the p type body region 3 and the n type impurity region 4 may be formed at the portion located between the trench gate structures.

(3) In the embodiment described above, the MOSFET of the n-channel type trench gate structure in which the first conductivity type is n-type and the second conductivity type is p-type has been described as an example of the semiconductor switching element. However, this is merely an example, and a semiconductor switching element of another structure, for example, a MOSFET of a trench gate structure of a p-channel type in which the conductivity type of each component is inverted with respect to the n-channel type may be used. In addition to the MOSFET, the present disclosure can be applied to an IGBT having a similar construction. In the IGBT case, except that the conductive type of the semiconductor substrate 1 is changed from the n-type to the p-type, the configuration is the same as the vertical MOSFET described in the embodiment described above.

What is claimed is:

1. A semiconductor device comprising:
   a semiconductor switching element including:
   a drift layer having a first conductive type;
   a body region having a second conductive type and arranged on the drift layer;
   a first impurity region having the first conductive type, arranged in a surface portion of the body region in the body region and having an impurity concentration higher than the drift layer;
   a plurality of trench gate structures, each of which includes a trench having one direction as a longitudinal direction and reaching the drift layer from the first impurity region with penetrating the body region, and each of which has a double-layered structure in which a shield electrode, an intermediate insulation film, and a gate electrode layer are stacked in order through an insulation film in the trench;
   a high impurity concentration layer having the first conductivity type or the second conductive type, arranged on a side opposite to the body region to sandwich the drift layer between the high impurity concentration layer and the body region, and having an impurity concentration higher than the drift layer;
   an interlayer insulation film arranged on the trench gate structures, the body region and the first impurity region, and having a contact hole connecting the body region and the first impurity region;
   an upper electrode electrically connected to the first impurity region and the body region through the contact hole; and
   a lower electrode electrically connected to the high impurity concentration layer;
   wherein the shield electrode extends outward from an end portion of the gate electrode layer, and the intermediate insulation film is arranged between the shield electrode and a bottom surface of the gate electrode layer and between the shield electrode and the end portion of the gate electrode layer,
   wherein a distance of a portion between the end portion of the gate electrode layer and the shield electrode in the one direction and having an insulation property is defined as an effective insulation distance,
   wherein the effective insulation distance is larger than a thickness of a portion of the intermediate insulation film located at a bottom portion of the gate electrode layer,
   wherein the interlayer insulation film further has an embedded insulation film embedded between the intermediate insulation film and the end portion of the gate electrode layer,
   wherein only the intermediate insulation film and the embedded insulation film are arranged between the end portion of the gate electrode layer and the shield electrode in the one direction, and
   wherein the effective insulation distance is a value equal to a sum of a thickness of a portion of the intermediate insulation film located at the end portion of the gate electrode layer and a width of the embedded insulation film.

2. A semiconductor device comprising:
   a semiconductor switching element including:
   a drift layer having a first conductive type;
   a body region having a second conductive type and arranged on the drift layer;
   a first impurity region having the first conductive type, arranged in a surface portion of the body region in the body region and having an impurity concentration higher than the drift layer;
   a plurality of trench gate structures, each of which includes a trench having one direction as a longitudinal direction and reaching the drift layer from the first impurity region with penetrating the body region, and each of which has a double-layered structure in which a shield electrode, an intermediate insulation film, and a gate electrode layer are stacked in order through an insulation film in the trench;
   a high impurity concentration layer having the first conductivity type or the second conductive type, arranged on a side opposite to the body region to sandwich the drift layer between the high impurity concentration layer and the body region, and having an impurity concentration higher than the drift layer;
   an interlayer insulation film arranged on the trench gate structures, the body region and the first impurity region, and having a contact hole connecting the body region and the first impurity region;
   an upper electrode electrically connected to the first impurity region and the body region through the contact hole; and
   a lower electrode electrically connected to the high impurity concentration layer;
   wherein the shield electrode extends outward from an end portion of the gate electrode layer, and the intermediate insulation film is arranged between the shield electrode and a bottom surface of the gate electrode layer and between the shield electrode and the end portion of the gate electrode layer,
   wherein a distance of a portion between the end portion of the gate electrode layer and the shield electrode in the one direction and having an insulation property is defined as an effective insulation distance,
   wherein the effective insulation distance is larger than a thickness of a portion of the intermediate insulation film located at a bottom portion of the gate electrode layer,
   wherein the interlayer insulation film further has an embedded insulation film embedded between the intermediate insulation film and the end portion of the gate electrode layer, wherein the gate electrode layer includes a residual portion as a portion of the gate electrode layer detached from a main portion of the gate electrode layer, wherein the embedded insulation film, the intermediate insulation film, and the residual portion are arranged between the end portion included in the main portion of the gate electrode layer and the shield electrode, and wherein the effective insulation distance is a value equal to a sum of a thickness of a portion of the intermediate insulation film located at the end portion of the gate electrode layer and a width of the embedded insulation film.

* * * * *